United States Patent
Mikulic et al.

(10) Patent No.: US 10,833,654 B2
(45) Date of Patent: Nov. 10, 2020

(54) OSCILLATOR CIRCUIT WITH COMPARATOR DELAY CANCELATION

(71) Applicant: ams AG, Premstaetten (AT)

(72) Inventors: Josip Mikulic, Graz (AT); Gregor Schatzberger, Graz (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/603,685

(22) PCT Filed: Apr. 9, 2018

(86) PCT No.: PCT/EP2018/059033
§ 371 (c)(1),
(2) Date: Oct. 8, 2019

(87) PCT Pub. No.: WO2018/192790
PCT Pub. Date: Oct. 25, 2018

(65) Prior Publication Data
US 2020/0119720 A1    Apr. 16, 2020

(30) Foreign Application Priority Data
Apr. 18, 2017  (EP) .................................. 17166860

(51) Int. Cl.
| | | |
|---|---|---|
| H03K 3/011 | (2006.01) | |
| H03K 3/0231 | (2006.01) | |
| H03K 3/354 | (2006.01) | |

(52) U.S. Cl.
CPC ........... *H03K 3/011* (2013.01); *H03K 3/0231* (2013.01); *H03K 3/354* (2013.01)

(58) Field of Classification Search
CPC ........ H03K 3/0231; H03K 4/50; H03K 4/501; H03K 4/502; H03K 3/011
See application file for complete search history.

(56) References Cited

U.S. PATENT DOCUMENTS

| | | |
|---|---|---|
| 7,474,163 B1 | 1/2009 | Wile et al. |
| 8,198,947 B2 | 6/2012 | Schatzberger |
| (Continued) | | |

FOREIGN PATENT DOCUMENTS

| | | |
|---|---|---|
| EP | 0944169 | 9/1999 |
| EP | 3316482 | 5/2018 |
| WO | 2012/099793 | 7/2012 |

OTHER PUBLICATIONS

Choe, K. et. al.: "A precision relaxation oscillator a self-clocked offset-cancellation scheme for implantable biomedical SoCs" 2009 IEEE International Solid-State Circuits Conference, pp. 402-403a (2009).

(Continued)

*Primary Examiner* — Ryan Johnson
(74) *Attorney, Agent, or Firm* — Fish & Richardson P.C.

(57) ABSTRACT

The oscillator circuit comprises first and second integrator units with a first capacitor charged at a first integration node and a second capacitor charged at a second integration node. A comparator unit is arranged between a first switching unit, which is connected to the integration nodes and to a reference signal (VREF), and a second switching unit. The comparator unit compares a signal from the first or second integration node with the reference signal. The second switching unit is connected to a logic unit configured to provide signals controlling the first integrator unit, the second integrator unit, the first switching unit and the second switching unit, so that a periodic operation is generated by alternatingly activating the first integrator unit and the second integrator unit.

9 Claims, 9 Drawing Sheets

(56) References Cited

U.S. PATENT DOCUMENTS

| | | | |
|---|---|---|---|
| 8,692,625 B2* | 4/2014 | Sinitsky | H03K 3/011 |
| | | | 331/111 |
| 9,602,052 B2* | 3/2017 | Satoh | G06F 1/04 |
| 2010/0327985 A1 | 12/2010 | Schatzberger | |
| 2015/0349710 A1 | 12/2015 | Wang et al. | |

OTHER PUBLICATIONS

European Patent Office, International Search Report for PCT/EP2018/059033, dated Jun. 20, 2018.
Radetic, M. R. et al.: "Chopper Stabilized Low Resistance Comparator" Sensors 2009, vol. 9, pp. 2491-2497 (2009).

* cited by examiner

US 10,833,654 B2

OSCILLATOR CIRCUIT WITH COMPARATOR DELAY CANCELATION

BACKGROUND OF THE INVENTION

U.S. Pat. No. 8,198,947 B2 describes an oscillator circuit with a charging unit comprising two capacitors, each capacitor being provided with two switches connected in series for feeding charging currents. Comparators compare the applied voltages to a reference voltage, and a flip-flop is used to control the operation of the switches. The capacitors are alternatingly loaded to generate the oscillation.

FIG. 8 is a diagram of an oscillator circuit, which comprises a first integrator unit 100, a second integrator unit 200 and a logic unit 400. A supply voltage is applied between a first supply terminal 8 and a second supply terminal 9. A logical high level may especially correspond to the electric potential that is applied to the first supply terminal 8, and a logical low level may especially correspond to the electric potential that is applied to the second supply terminal 9, which will be referred to as reference potential and may in particular be ground.

The first integrator unit 100 comprises a first charging unit 120, a first capacitor 110, a first comparator 151 and a second comparator 152. The second integrator unit 200 comprises a second charging unit 220, a second capacitor 210, a third comparator 251 and a fourth comparator 252. The logic unit 400 comprises a first logic component 160/170, a second logic component 260/270 and a flip-flop 301, which can be an SR (set-reset) flip-flop, for instance.

The first charging unit 120 comprises a first current source 111 and a second current source 112, which are connected to the first supply terminal 8. A first switch 101 is connected between the first current source 111 and a first integration node 121, and a second switch 102 is connected between the second current source 112 and the first integration node 121. A third switch 103 is connected between the first integration node 121 and the second supply terminal 9 and is switched by the output signal of a first NOR gate 130. A third current source 113 is connected to the second supply terminal 9. A fourth switch 104 is connected between the first integration node 121 and the third current source 113.

The first charging unit 120 is thus coupled to the first integration node 121 in a switchable manner. The first current source 111 and the third current source 113 provide currents corresponding to a reference current IREF, and the second current source 112 provides a current corresponding to half the reference current IREF.

A non-inverting input (+) of the first comparator 151 and an inverting input (−) of the second comparator 152 are connected to the first integration node 121. An inverting input (−) of the first comparator 151 and a non-inverting input (+) of the second comparator 152 are supplied with a reference signal VREF, which can be a reference voltage, for instance, and is dimensioned in accordance with the operating regions of the current sources and the comparators. The reference signal VREF and the reference current IREF can be provided in a reference generator unit, which is not shown in the diagram.

The first capacitor 110 is connected between the first integration node 121 and the second supply terminal 9. The first charging unit 120 provides a first charging current IREF1 and a first integration signal VC1, which may be a voltage drop across the first capacitor 110.

The second charging unit 220 comprises a fourth current source 211 and a fifth current source 212, which are connected to the first supply terminal 8. A fifth switch 201 is connected between the fourth current source 211 and a second integration node 221, and a sixth switch 202 is connected between the fifth current source 212 and the second integration node 221. A seventh switch 203 is connected between the second integration node 221 and the second supply terminal 9 and is switched by the output signal of a second NOR gate 230. A sixth current source 213 is connected to the second supply terminal 9. An eighth switch 204 is connected between the second integration node 221 and the sixth current source 213.

The second charging unit 220 is thus coupled to the second integration node 221 in a switchable manner. The fourth current source 211 and the sixth current source 213 provide currents corresponding to the reference current IREF, and the fifth current source 212 provides a current corresponding to half the reference current IREF.

A non-inverting input (+) of the third comparator 251 and an inverting input (−) of the fourth comparator 252 are connected to the second integration node 221. An inverting input (−) of the third comparator 251 and a non-inverting input (+) of the fourth comparator 252 are supplied with the reference signal VREF.

The second capacitor 210 is connected between the second integration node 221 and the second supply terminal 9. The second charging unit 220 provides a second charging current IREF2 and a second integration signal VC2, which may be a voltage drop across the second capacitor 210.

The first logic component may comprise a first inverter 160 and a first AND gate 170. The output of the first inverter 160 is connected to an input of the first AND gate 170. An output of the flip-flop 301 is connected to another input of the first AND gate 170.

The second logic component may comprise a second inverter 260 and a second AND gate 270. The output of the second inverter 260 is connected to an input of the second AND gate 270. The output of the flip-flop 301 that is not connected to the first AND gate 170 is connected to another input of the second AND gate 270.

A first comparator signal A1 is provided at the output of the first comparator 151, a second comparator signal A2 is provided at the output of the second comparator 152, a third comparator signal B1 is provided at the output of the third comparator 251, and a fourth comparator signal B2 is provided at the output of the fourth comparator 252. The comparator signals A1, A2, B1, B2 may be voltages, for instance.

The flip-flop 301 receives the first comparator signal A1 on its set input and the third comparator signal B1 on its reset input and yields a clock signal CLK1 and an inverted clock signal CLK2.

The first logic component receives the second comparator signal A2, in particular at the input of the first inverter 160. The inputs of the first AND gate 170 receive the second comparator signal A2 in inverted form and the clock signal CLK1, so that a first measurement signal D1 is generated at the output of the first logic component. The second logic component receives the fourth comparator signal B2, in particular at the input of the second inverter 260. The inputs of the second AND gate 270 receive the fourth comparator signal B2 in inverted form and the inverted clock signal CLK2, so that a second measurement signal D2 is generated at the output of the second logic component.

The first switch 101 is controlled by the inverted clock signal CLK2. The second switch 102 is controlled by the second measurement signal D2. The first measurement signal D1 and the inverted clock signal CLK2 are applied to the inputs of the first NOR gate 130 switching the third switch 103. The fourth switch 104 is controlled by the first measurement signal D1. The fifth switch 201 is controlled by the clock signal CLK1. The sixth switch 202 is controlled by the first measurement signal D1. The second measurement signal D2 and the clock signal CLK1 are applied to the inputs of the second NOR gate 230 switching the seventh switch 203. The eighth switch 204 is controlled by the second measurement signal D2. Each of the switches is closed to be conducting when a high level is applied, and is open and thus interrupts the electric connection when a low level is applied.

FIG. 9 shows diagrams of various voltages as functions of the time t. The voltages represent the relevant signals occurring in the oscillator circuit during its operation. From top to bottom, the diagrams show the first integration signal VC1, the second integration signal VC2, the first comparator signal A1, the second comparator signal A2, the third comparator signal B1, the fourth comparator signal B2, the first measurement signal D1, the second measurement signal D2, the clock signal CLK1 and the inverted clock signal CLK2.

At a starting time corresponding to the starting point of the time lines, the clock signal CLK1 is presumed to be at the high level, so that the inverted clock signal CLK2 is at the low level. The capacitors 110, 210 are assumed to be completely discharged. Consequently, the first comparator signal A1 and the third comparator signal B1 are at the low level, whereas the second comparator signal A2 and the fourth comparator signal B2 are at the high level. Hence the first and second measurement signals D1, D2 are at the low level. The output of the first NOR gate 130 is at the high level, and the output of the second NOR gate 230 is at the low level.

In this state the first switch 101, the second switch 102, the fourth switch 104, the sixth switch 202, the seventh switch 203 and the eighth switch 204 are open, and the third switch 103 and the fifth switch 201 are closed. This ensures that the first integration signal VC1 is at the low level, while the second capacitor 210 is being charged with the second charging current IREF2 provided by the fourth current source 211 according to the reference current IREF. The second integration signal VC2 increases linearly with a slew rate that is equal to the quotient of the reference current IREF and the capacitance of the second capacitor 210.

At a first time t1, the second integration signal VC2 reaches the reference signal VREF. Then the output current of the third comparator 251 starts to charge the parasitic capacitances at its output. The third comparator signal B1 increases, and the fourth comparator signal B2 decreases.

At a second time t2, after a delay td, the third comparator signal B1 reaches the switching level of the third comparator 251, which corresponds to a threshold voltage VTHR and may be approximately the median of the supply voltage, for instance. The fourth comparator signal B2 is below the threshold voltage VTHR. At that moment the reset signal of the flip-flop 301 is activated and the state of the flip-flop 301 changes. The clock signal CLK1 is set to the low level, so that the inverted clock signal CLK2 is set to the high level.

The first switch 101 is closed and connects the first integration node 121 to the first current source 111. The third switch 103 is opened and disconnects the first integration node 121 from the second supply terminal 9. According to the inverted clock signal CLK2, the second measurement signal D2 changes from the low level to the high level. Hence the second switch 102 is closed and connects the first integration node 121 to the second current source 112. The first integration signal VC1 increases linearly, with a slew rate equal to the quotient of one and a half times the reference current IREF and the capacitance of the first capacitor 110. The fourth switch 104, the sixth switch 202 and the seventh switch 203 remain open. The fifth switch 201 is opened and disconnects the fourth current source 211 from the second integration node 221 and thus from the second capacitor 210.

The eighth switch 204 is closed, so that the sixth current source 213 starts to discharge the second capacitor 210 with a slew rate equal to the quotient of the reference current IREF and the capacitance of the second capacitor 210. As the slew rates of the second integration signal VC2 have the same absolute value before and after the second time t2, the second integration signal VC2 reaches the reference voltage VREF again after the delay td at a third time t3.

At the third time t3, the voltages at the input terminals of the fourth comparator 252 are reversed with respect to the third comparator 251. The fourth comparator 252 now enters an operational phase that is similar to the operational phase that the third comparator 251 entered at the first time t1. At a fourth time t4, after a further delay td, the fourth comparator signal B2 reaches the switching level of the fourth comparator 252, which corresponds to the threshold voltage VTHR, and the second measurement signal D2 changes from the high level back to the low level.

The second switch 102 and the eighth switch 204 are opened, and the seventh switch 203 is closed. The first switch 101, the third switch 103, the fourth switch 104, the fifth switch 201 and the sixth switch 202 remain in their positions. As a result, the second integration signal VC2 is discharged to the low level, and the first capacitor 110 is being charged with the current from the first current source 111 corresponding to the reference current IREF. Therefore the slew rate of the first integration signal VC1 is equal to the quotient of the reference current IREF and the capacitance of the first capacitor 110.

At a fifth time t5, the first integration signal VC1 reaches the reference signal VREF. The first capacitor 110 is being charged, until the state of the flip-flop 301 is changed again at a sixth time t6, after a further delay td, and the first capacitor 110 starts to discharge. At a seventh time t7, after a further delay td, the first integration signal VC1 falls below the level of the reference signal VREF. At an eighth time t8, the next integration phase starts within the first integrator unit 100.

Because of the symmetry of the first integrator unit 100 and the second integrator unit 200, the waveform of the first integration signal VC1 starting at the second time t2 is equal to the waveform of the second integration signal VC2 starting at the sixth time t6. The time interval during which the first measurement signal D1 is at the high level has the same duration as the time interval during which the second measurement signal D2 is at the high level, and this duration equals twice the delay td. A period T is equal to the duration of the time interval from the second time t2 to the eighth time t8 and depends only on the passive components of the oscillator circuit.

The first capacitor 110 with capacitance C is charged at the slew rate 1.5·IREF/C from the second time t2 to the fourth time t4, and this time interval equals twice the delay td. The value of the first integration signal VC1 at the fourth time t4 would be obtained with the slew rate IREF/C during a time interval equal to three times the delay td, the first integration signal VC1 would then reach the reference signal VREF at the sixth time t6, and the maximal value of the first integration signal VC1 would be reached at the seventh time t7, which is later than the sixth time t6 by the delay td. Hence the time interval from the second time t2 to the sixth time t6 is VREF·C/IREF. This time interval is equal to T/2, half the duration of the period T, as can be seen from a comparison of the waveforms of the first integration signal VC1 and the second integration signal VC2.

The start of a charging phase of the first integrator unit 100 triggers the start of a discharging phase of the second integrator unit 200 and vice versa. The first integration, which is reflected in the first integration signal VC1, is thus performed in counter-phase to the second integration, which is reflected in the second integration signal VC2.

FIG. 10 is a diagram of the second integration voltage VC2 as a function of the time t for a variant of the oscillator circuit, in which an offset voltage VOFF is applied to the input of the third comparator 251 and to the input of the fourth comparator 252. The second measurement signal D2 is shown under the time line.

If an offset voltage VOFF is added to the reference signal VREF, the activation of the third comparator signal B1 by the third comparator 251 is retarded by an offset time tx, which is equal to the offset voltage VOFF divided by the slew rate of the second integration signal VC2: tx=VOFF·C/IREF. The time interval from the delayed first time t1'=t1+tx to the second time t2 is equal to the delay td of the third comparator 251. The time interval from the first time t1 to the second time t2 will be referred to as the effective delay td' of this variant.

The second integration signal VC2 reaches the reference signal VREF again at the third time t3. As the slew rates of the second integration signal VC2 have the same absolute value before and after the second time t2, the time interval from the second time t2 to the third time t3 is the same as the time interval from the first time t1 to the second time t2, the effective delay td'.

Since the fourth comparator 252 has the inverted phase, the offset voltage VOFF is in effect subtracted from the reference signal VREF. The offset time tx from the third time t3 to the delayed third time t3' is needed for the activation of the fourth comparator signal B2. Starting from the delayed third time t3', the delay td is needed until the fourth comparator signal B2 reaches the threshold voltage VTHR at the fourth time t4.

The time interval during which the second measurement signal D2 is at the high level equals twice the effective delay td', which is also equal to the time interval during which the second integration signal VC2 is above the reference signal VREF. Hence any influence of the offset voltage VOFF on the duration of the period T is canceled out.

The operation of the oscillator circuit may be impaired by a mismatch of the comparators, which may result in random offset. Such a mismatch can be reduced by increasing the size of the comparators, but the performance of the oscillator circuit may be deteriorated by the increased input capacitances, which affect the output frequency. If the size of the comparators is instead decreased in order to reduce the influence of the input capacitances, it may be difficult to match the comparators sufficiently well.

SUMMARY OF THE INVENTION

The oscillator circuit includes integrators, comparators and a flip-flop controlling the integrators. In a first half cycle, one integrator is active until a reference signal is reached, and then a set signal is sent to the flip-flop to change its state. The integration is then performed on the other integrator and the cycle repeats. The oscillator circuit exhibits less power consumption and less sensitivity of the output frequency to mismatch and process variation. Moreover, the influence of parasitic capacitances on the output frequency is substantially reduced.

The oscillator circuit comprises a first integrator unit with a first capacitor configured to be charged at a first integration node, and a similar second integrator unit with a second capacitor configured to be charged at a second integration node, each integrator unit including switchable current sources. A comparator unit is arranged between a first switching unit and a second switching unit, the first switching unit having a first input connected to the first integration node, a second input connected to a reference signal, and a third input connected to the second integration node. The comparator unit is configured to compare a signal at the first input or a signal at the third input with the reference signal. The second switching unit is connected to a logic unit configured to provide signals controlling the first integrator unit, the second integrator unit, the first switching unit and the second switching unit, so that a periodic operation is generated by alternatingly activating the first integrator unit and the second integrator unit.

In an embodiment of the oscillator circuit, each period of the periodic operation has a duration that is equal to the performance of charging the first capacitor with a first slew rate, while a second integration signal corresponding to the charging of the second capacitor is zero, until a first integration signal corresponding to the charging of the first capacitor exceeds the reference signal by a predefined value, then discharging the first capacitor with the first slew rate, while the second capacitor is charged with a second slew rate, which is larger than the first slew rate, until the first integration signal has fallen below the reference signal by a further predefined value, then charging the second capacitor with the first slew rate, while the first integration signal is zero, until the second integration signal exceeds the reference signal by the predefined value, and then discharging the second capacitor with the first slew rate, while the first capacitor is charged with the second slew rate, until the second integration signal has fallen below the reference signal by the further predefined value.

A further embodiment comprises a first supply terminal for a supply voltage and a second supply terminal for a reference potential, a first switch, a second switch, a third switch and a fourth switch of the first integrator unit, and a fifth switch, a sixth switch, a seventh switch and an eighth switch of the second integrator unit. A first current source is connected between the first supply terminal and the first switch, a second current source is connected between the first supply terminal and the second switch, and a third current source is connected between the second supply terminal and the fourth switch. The first switch is connected between the first current source and the first integration node, the second switch is connected between the second current source and the first integration node, the third switch is connected between the second supply terminal and the first integration node, and the fourth switch is connected between the third current source and the first integration node. A fourth current source is connected between the first supply terminal and the fifth switch, a fifth current source is connected between the first supply terminal and the sixth switch, and a sixth current source is connected between the second supply terminal and the eighth switch. The fifth switch is connected between the fourth current source and the second integration node, the sixth switch is connected between the fifth current source and the second integration node, the seventh switch is connected between the second supply terminal and the second integration node, and the eighth switch is connected between the sixth current source and the second integration node.

A further embodiment comprises a first output and a second output of the first switching unit, a ninth switch between the first input and the first output, a tenth switch between the second input and the first output, an eleventh switch between the second input and the second output, and a twelfth switch between the third input and the second output. The ninth switch and the eleventh switch are simultaneously opened and closed. The tenth switch and the twelfth switch are also simultaneously opened and closed, so that the ninth switch and the eleventh switch are both open when the tenth switch and the twelfth switch are both closed and vice versa.

A further embodiment comprises a third output and a fourth output of the first switching unit, and a propagation enable signal generation circuit, which is connected to the first input, the second input, the third input, the third output and the fourth output. The propagation enable signal generation circuit compares the reference signal at the second input with a signal at the first input and with a signal at the third input.

A further embodiment comprises a first comparator and a second comparator of the comparator unit. The first output of the first switching unit is connected to a non-inverting input of the first comparator and to an inverting input of the second comparator. The second output of the first switching unit is connected to an inverting input of the first comparator and to a non-inverting input of the second comparator.

A further embodiment comprises a fourth input, a fifth input, a fifth output, a sixth output, a seventh output and an eighth output at the second switching unit. The fourth input is connected to an output of the first comparator. The fifth input is connected to an output of the second comparator. A thirteeth switch is present between the fourth input and the seventh output, a fourteenth switch between the second supply terminal and the seventh output, a fifteenth switch between the first supply terminal and the sixth output, a sixteenth switch between the fourth input and the sixth output, a seventeenth switch between the fifth input and the fifth output, an eighteenth switch between the first supply terminal and the fifth output, a nineteenth switch between the second supply terminal and the eighth output, and a twentieth switch between the fifth input and the eighth output. The thirteeth switch, the fifteenth switch, the seventeenth switch and the nineteenth switch are simultaneously opened and closed. The fourteenth switch, the sixteenth switch, the eighteenth switch and the twentieth switch are also simultaneously opened and closed, so that the thirteeth switch, the fifteenth switch, the seventeenth switch and the nineteenth switch are open when the fourteenth switch, the sixteenth switch, the eighteenth switch and the twentieth switch are closed and vice versa.

A further embodiment comprises a first NOR gate, a second NOR gate, a first NAND gate and a second NAND gate of the logic unit. The first NOR gate is connected to the first switching unit via a first inverter and to the second switching unit. The second NOR gate is connected to the first switching unit via a second inverter and to the second switching unit. The first NAND gate and the second NAND gate are connected to the first switching unit and to the second switching unit.

A further embodiment comprises a third NOR gate, a fourth NOR gate, a first AND gate, a second AND gate, a first flip-flop and a second flip-flop of the logic unit. Inputs of the first flip-flop are connected to outputs of the first NOR gate and the second NOR gate. One output of the first flip-flop is connected to inputs of the fourth NOR gate and the first AND gate. Another output of the first flip-flop is connected to inputs of the third NOR gate and the second AND gate. A further input of the third NOR gate is connected to an output of the first NAND gate and to a further input of the first AND gate. A further input of the fourth NOR gate is connected to an output of the second NAND gate and to a further input of the second AND gate. Outputs of the first AND gate and the second AND gate are connected to inputs of the second flip-flop. Outputs of the second flip-flop are connected to the first switching unit and the second switching unit.

In a further embodiment, the signals controlling the first integrator unit and the second integrator unit are provided at outputs of the third NOR gate, the fourth NOR gate, the first AND gate, the second AND gate and the first flip-flop, and the signals controlling the first switching unit and the second switching unit are provided at the outputs of the second flip-flop.

BRIEF DESCRIPTION OF THE DRAWINGS

The following is a detailed description of examples of the oscillator circuit and the method of propagation delay cancelation in conjunction with the appended figures.

DETAILED DESCRIPTION

Figure 1:
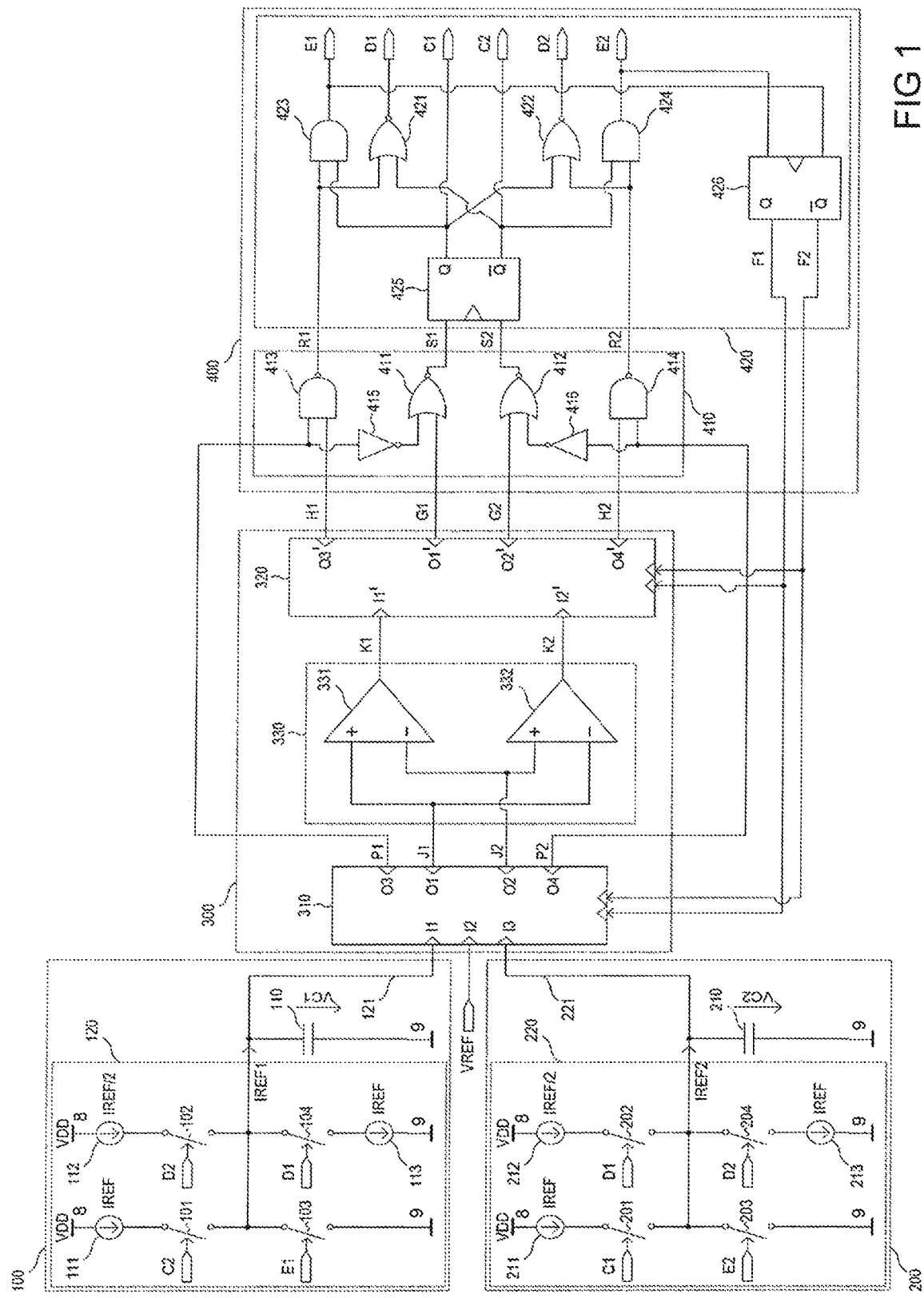
FIG. 1 is a diagram of an entire oscillator circuit.
Figure 8:
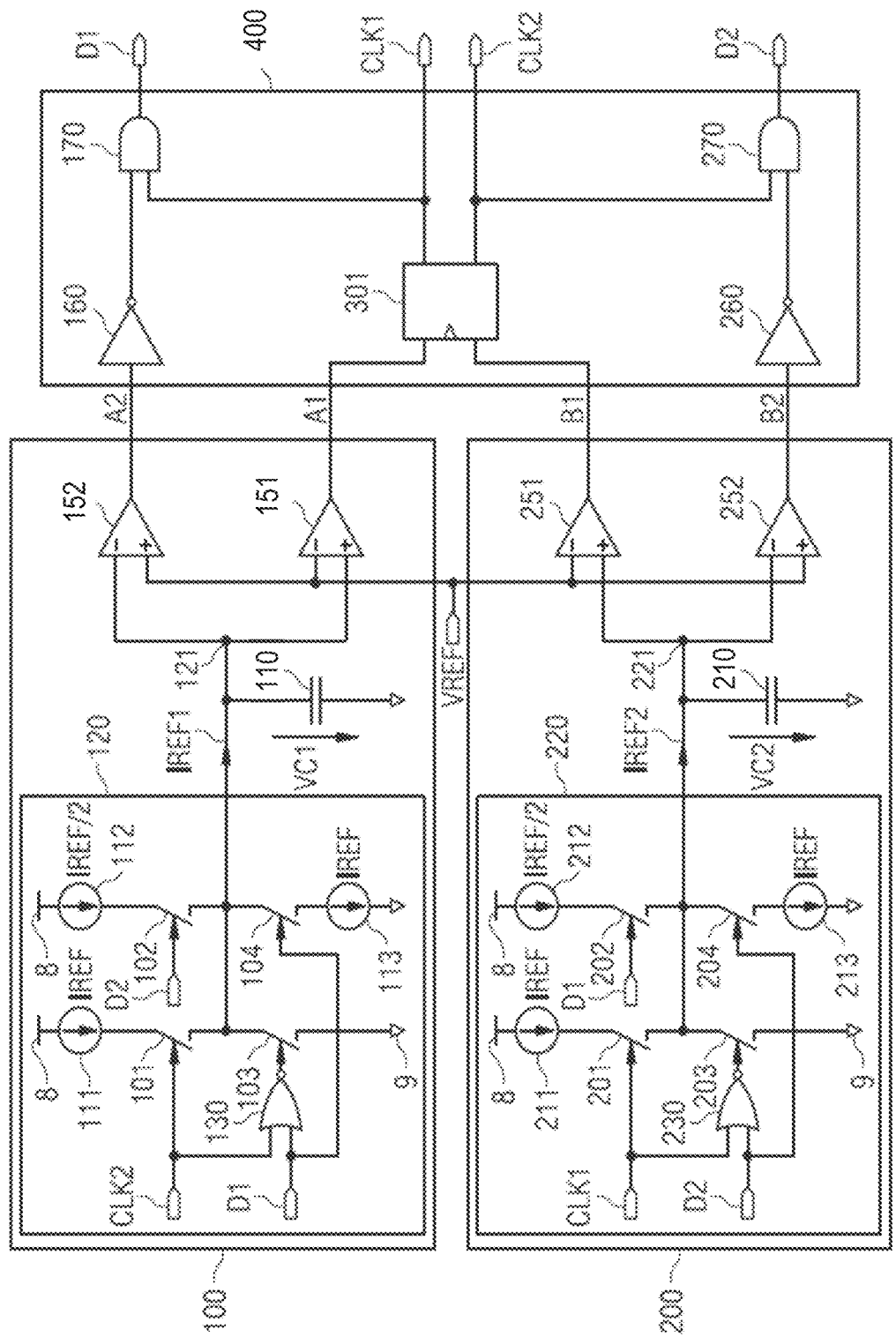
FIG. 8 is a diagram of a basic oscillator circuit.
Figure 9:
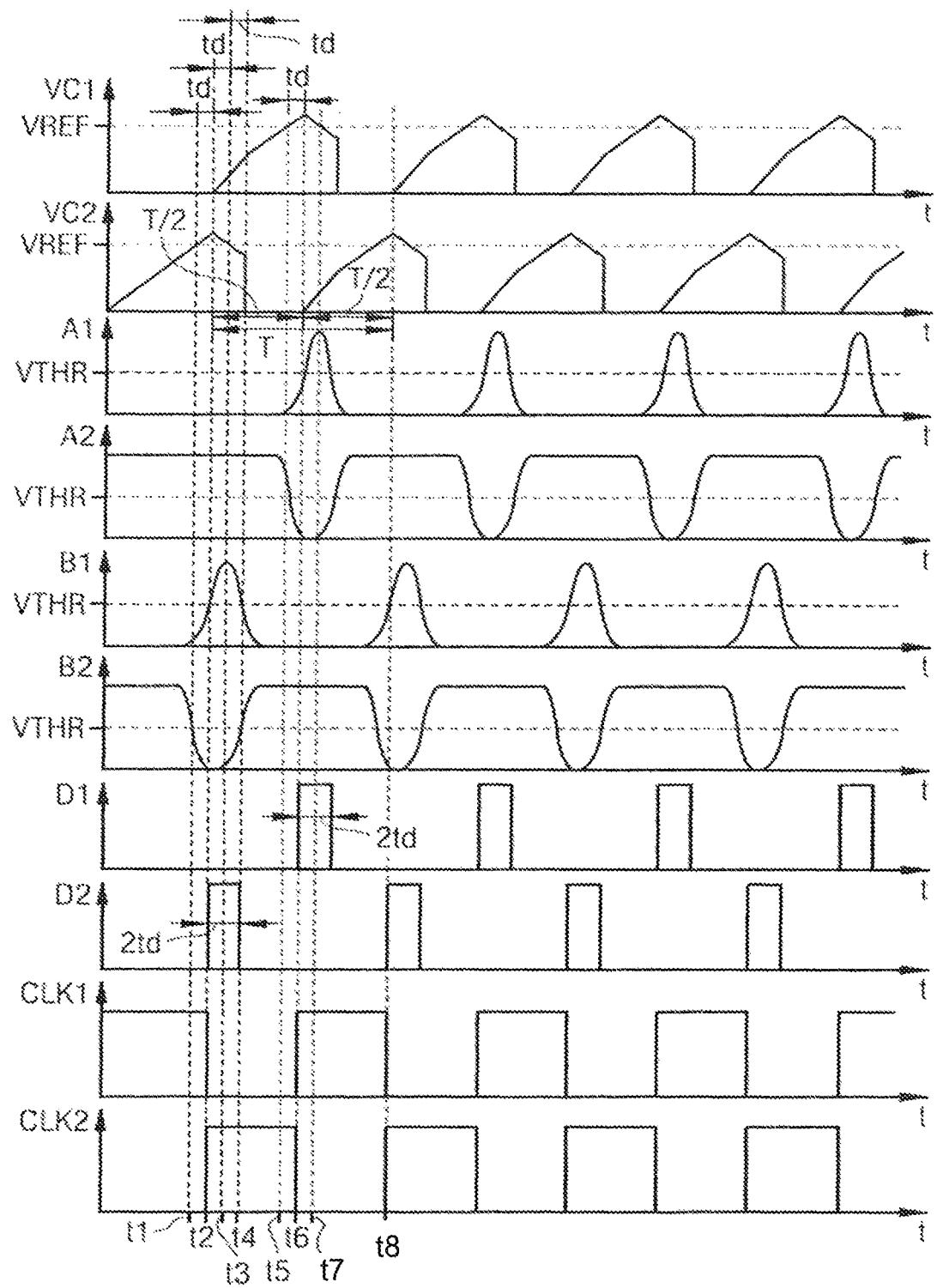
FIG. 9 is a diagram of voltages as functions of the time for the oscillator circuit according to FIG. 8.
Figure 10:
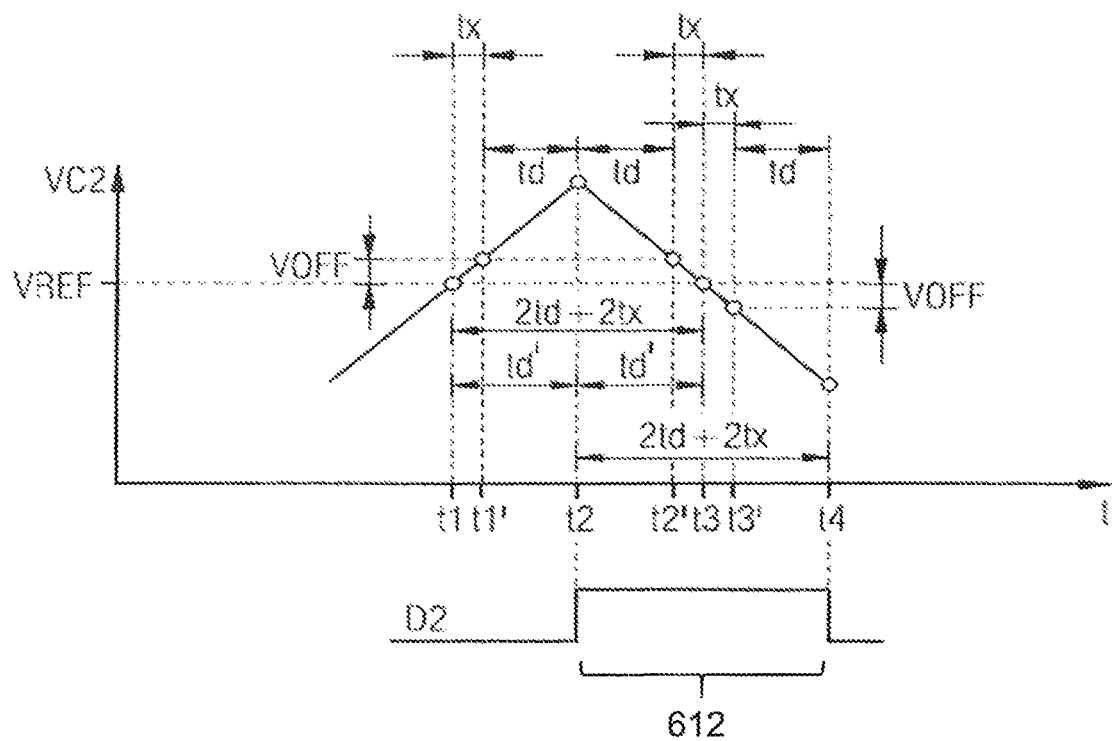
FIG. 10 is a diagram of an integration signal for the oscillator circuit according to FIG. 8.

FIG. 1 is a diagram of an oscillator circuit based on the oscillator circuit according to FIG. 8. The oscillator circuit comprises a first integrator unit 100, a second integrator unit 200, a selection unit 300 and a logic unit 400.

A first supply terminal 8 and a second supply terminal 9 are provided for the application of a supply voltage. The electric potential that is applied to the first supply terminal 8 will be referred to as VDD, and the electric potential that is applied to the second supply terminal 9 will be referred to as reference potential. The second supply terminal 9 may be connected to ground, for instance. A reference signal VREF, which may be a further voltage, and a reference current IREF may be provided in a reference generator unit. Such a reference generator unit is known per se and not shown in the circuit diagram of FIG. 1.

The integration is performed on one of the integrator units 100, 200, while the other integrator unit is idle. The selection unit 300 senses the moment when the voltage of the integration node reaches the reference signal VREF, and then changes the state of the logic unit 400. As a result, the active integrator unit becomes idle, and the previously idle integrator unit becomes active. The same half cycle is repeated. The oscillator circuit may also comprise circuitry for the measurement and cancelation of the propagation delay to enhance the precision of the oscillation frequency.

The first integrator unit 100 comprises a first charging unit 120 and a first capacitor 110 with capacitance C. The first charging unit 120 comprises a first current source 111 and a second current source 112, which are connected to the first supply terminal 8. A first switch 101 is connected between the first current source 111 and a first integration node 121, and a second switch 102 is connected between the second current source 112 and the first integration node 121. A third switch 103 is connected between the first integration node 121 and the second supply terminal 9. A third current source 113 is connected to the second supply terminal 9. A fourth switch 104 is connected between the first integration node 121 and the third current source 113. The first capacitor 110 is connected between the first integration node 121 and the second supply terminal 9.

The first switch 101 is controlled by a second clock signal C2, the second switch 102 is controlled by a second measurement signal D2, the third switch 103 is controlled by a first integration disable signal E1, and the fourth switch 104 is controlled by a first measurement signal D1. Inside the first charging unit 120 a first charging current IREF1 is generated. The first charging current IREF1 is employed to charge the first capacitor 110. The voltage across the first capacitor 110 represents the integration of the first charging current IREF1. This voltage is the output of the first integrator unit 100 and will be referred to as first integration signal VC1.

The function of the first integrator unit 100 is to perform the integration during the active state of the second clock signal C2. The rate of the integration is intended to adapt during the active state of the second measurement signal D2 in a way that the propagation delay caused by the following stages gets canceled. During the active state of the first measurement signal D1, the rate of the integration is intended to adapt further to enable the measurement of the experienced propagation delay. The first integrator unit 100 is intended to remain idle during the active state of the first integration disable signal E1.

The second integrator unit 200 comprises a second charging unit 220 and a second capacitor 210 with capacitance C. The second charging unit 220 comprises a fourth current source 211 and a fifth current source 212, which are connected to the first supply terminal 8. A fifth switch 201 is connected between the fourth current source 211 and a second integration node 221, and a sixth switch 202 is connected between the fifth current source 212 and the second integration node 221. A seventh switch 203 is connected between the second integration node 221 and the second supply terminal 9. A sixth current source 213 is connected to the second supply terminal 9. An eighth switch 204 is connected between the second integration node 221 and the sixth current source 213. The second capacitor 210 is connected between the second integration node 221 and the second supply terminal 9.

The fifth switch 201 is controlled by a first clock signal C1, the sixth switch 202 is controlled by a first measurement signal D1, the seventh switch 203 is controlled by a second integration disable signal E2, and the eighth switch 204 is controlled by a second measurement signal D2. Inside the second charging unit 220 a second charging current IREF2 is generated. The second charging current IREF2 is employed to charge the second capacitor 210. The voltage across the second capacitor 210 represents the integration of the second charging current IREF2. This voltage is the output of the second integrator unit 200 and will be referred to as second integration signal VC2.

The function of the second integrator unit 200 is to perform the integration during the active state of the first clock signal C1. The rate of the integration is intended to adapt during the active state of the first measurement signal D1 in a way that the propagation delay caused by the following stages gets canceled. During the active state of the second measurement signal D2, the rate of the integration is intended to adapt further to enable the measurement of the experienced propagation delay. The second integrator unit 200 is intended to remain idle during the active state of the second integration disable signal E2.

The selection unit 300 comprises a first switching unit 310, a second switching unit 320 and a comparator unit 330. The selection unit 300 alternatively connects the first integration node 121 and the second integration node 221 to the comparator unit 330. The integration is performed on the connected integrator unit 100, 200 to generate a signal that changes the state of the relevant clock signal when the integration signal reaches the reference signal VREF.

The selection unit 300 takes the first integration node 121, the second integration node 221 and the reference signal VREF as inputs. In addition, a first switching state signal F1 and a second switching state signal F2 are used to control the state of the selection unit 300 at any given moment. The selection unit 300 provides the following outputs: a first clock generation signal G1, a second clock generation signal G2, a first replica clock generation signal H1, a second replica clock generation signal H2, a first propagation enable signal P1 and a second propagation enable signal P2.

Figure 2:
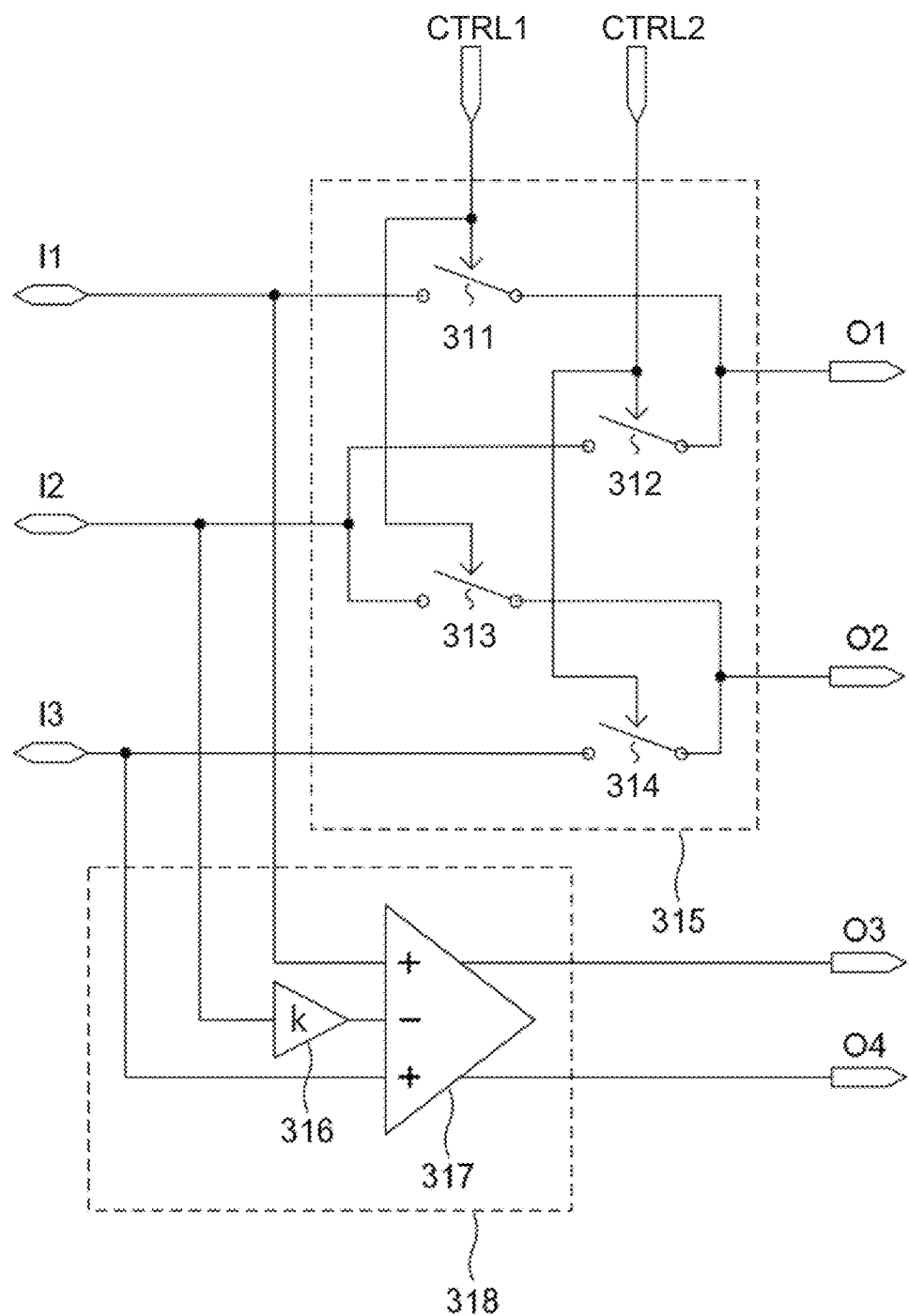
FIG. 2 is a circuit diagram of a first switching unit.

FIG. 2 is a circuit diagram of the first switching unit 310, which comprises a first input I1, a second input I2, a third input I3, a first output O1, a second output O2, a third output O3 and a fourth output O4. It includes a switching unit 315 and a propagation enable signal generation circuit 318.

In the example shown in FIG. 2, the switching unit 315 includes a ninth switch 311 between the first input I1 and the first output O1, a tenth switch 312 between the second input I2 and the first output O1, an eleventh switch 313 between the second input I2 and the second output O2, and a twelfth switch 314 between the third input I3 and the second output O2. A first control signal CTRL1 and a second control signal CTRL2 inside the first switching unit 310 control the switching operation of the switching unit 315. In the example shown in FIG. 2, the first control signal CTRL1 controls the ninth switch 311 and the eleventh switch 313, and the second control signal CTRL2 controls the tenth switch 312 and the twelfth switch 314.

During the active state of the first control signal CTRL1, the second control signal CTRL2 is in the inactive state, so that the ninth switch 311 and the eleventh switch 313 are closed, and the tenth switch 312 and the twelfth switch 314 are open. Consequently, the first input I1 is connected to the first output O1, and the second input I2 is connected to the second output O2.

During the active state of the second control signal CTRL2, the first control signal CTRL1 is in the inactive state, so that the tenth switch 312 and the twelfth switch 314 are closed and the ninth switch 311 and the eleventh switch 313 are open. Consequently, the second input I2 is connected to the first output O1, and the third input I3 is connected to the second output O2.

The function of the propagation enable signal generation circuit 318 is to provide the active state of its outputs when the relevant integration node is in a region where the comparison to the reference signal VREF takes place and the output states of the comparators are affected. The outputs will then enable the propagation of required signals, otherwise masking them to preserve the signal integrity.

The propagation enable signal generation circuit 318 is connected to the first input I1, the second input I2, the third input I3, the third output O3 and the fourth output O4. It compares a signal at the first input I1 with a signal at the second input I2 and compares a signal at the second input I2 with a signal at the third input I3. The first input I1 is connected to the first integration node 121, the second input I2 is connected to the reference signal VREF, and the third input I3 is connected to the second integration node 221.

In particular, the propagation enable signal generation circuit 318 may comprise a voltage divider 316 and a comparator 317, by way of example. The voltage divider 316 is connected between the second input I2 and an inverting input (−) of the comparator 317. The first input I1 and the third input I3 are connected to non-inverting inputs (+) of the comparator 317. The outputs of the comparator 317 are respectively connected to the third output O3 and to the fourth output O4.

The voltage divider 316 scales the reference voltage VREF with a suitable scaling factor k, 0<k<1. The resulting voltage is applied to the inverting input (−) of the comparator 317. The comparison with the voltage at the first input I1 yields a signal at the third output O3, and the comparison with the voltage at the third input I3 yields a further signal at the fourth output O4.

Thus the first output O1 yields a first comparator unit input signal J1, the second output O2 yields a second comparator unit input signal J2, the third output O3 yields the first propagation enable signal P1, and the fourth output O4 yields the second propagation enable signal P2. The first control signal CTRL1 and the second control signal CTRL2 correspond to a first switching state signal F1 and a second switching state signal F2, respectively.

The comparator unit 330 comprises a first comparator 331 and a second comparator 332. The first comparator 331 and the second comparator 332 are optionally designed to have the same structure and similar electrical properties. The first comparator unit input signal J1 is applied to a non-inverting input of the first comparator 331 and to an inverting input of the second comparator 332. The second comparator unit input signal J2 is applied to an inverting input of the first comparator 331 and to a non-inverting input of the second comparator 332. Thus opposite phases are obtained at the outputs of the first comparator 331 and the second comparator 332, if the influence of mismatch and offset voltage at the inputs of the comparator can be neglected.

The first comparator 331 and the second comparator 332 may be designed such that low-to-high transition of the output happens faster compared to high-to-low transition of the output. This can also be interpreted as a systematic offset voltage at the input of the comparators. The purpose of this feature is to preserve the signal integrity during the circuit operation.

The first comparator unit output signal K1 and the second comparator unit output signal K2 will essentially always have an opposite phase. The connection of the comparator unit 330 to the first switching unit 310 and the second switching unit 320 are to be realized in a way that, at any given moment, depending on the state of the switching units 310, 320 and determined by the state of the first switching state signal F1 and the second switching state signal F2, either the first comparator 311 or the second comparator 312 serves as an original comparator while the other one serves as a replica comparator. Their function alternates with every change of the first switching state signal F1 and the second switching state signal F2.

The original comparator has the function to track a voltage on one of the integrating nodes 121, 221 and to compare it to the reference signal VREF, generating one of the clock generation signals G1, G2. The replica comparator is intended to replicate the operation of the original comparator at a time shift, providing the propagation delay information in form of one of the replica clock generation signals H1, H2.

Figure 3:
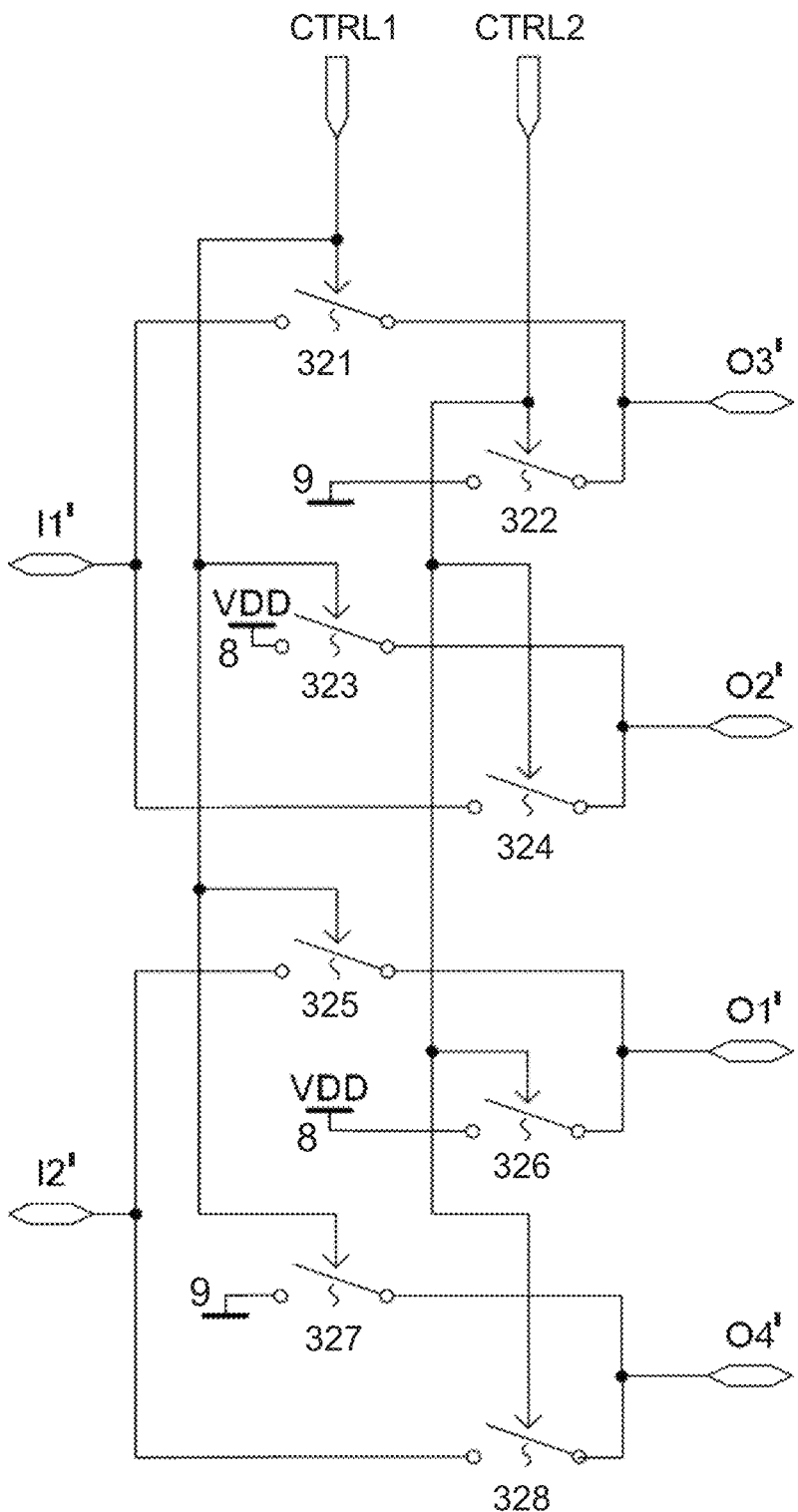
FIG. 3 is a circuit diagram of a second switching unit.

FIG. 3 is a circuit diagram of the second switching unit 320 which comprises a fourth input I1', a fifth input I2', a fifth output O1', a sixth output O2', a seventh output O3' and an eighth output O4'. In the example shown in FIG. 3, it includes a thirteeth switch 321 between the fourth input I1' and the seventh output O3', a fourteenth switch 322 between the second supply terminal 9 and the seventh output O3', a fifteenth switch 323 between the first supply terminal 8 and the sixth output O2', a sixteenth switch 324 between the fourth input I1' and the sixth output O2', a seventeenth switch 325 between the fifth input I2' and the fifth output O1', an eighteenth switch 326 between the first supply terminal 8 and the fifth output O1', a nineteenth switch 327 between the second supply terminal 9 and the eighth output O4', and a twentieth switch 328 between the fifth input I2' and the eighth output O4'.

The first control signal CTRL1 and the second control signal CTRL2 inside the second switching unit 320 control the switching operation. In the example shown in FIG. 3, the first control signal CTRL1 controls the thirteenth switch 321, the fifteenth switch 323, the seventeenth switch 325 and the nineteenth switch 327, and the second control signal CTRL2 controls the fourteenth switch 322, the sixteenth switch 324, the eighteenth switch 326 and the twentieth switch 328.

During the active state of the first control signal CTRL1, the second control signal CTRL2 is in the inactive state, so that the thirteenth switch 321, the fifteenth switch 323, the seventeenth switch 325 and the nineteenth switch 327 are closed, and the fourteenth switch 322, the sixteenth switch 324, the eighteenth switch 326 and the twentieth switch 328 are open. Consequently, the fourth input I1' is connected to the seventh output O3', the fifth input I2' is connected to the fifth output O1', the first supply terminal 8 is connected to the sixth output O2', and the second supply terminal 9 is connected to the eighth output O4'.

During the active state of the second control signal CTRL2, the first control signal CTRL1 is in the inactive state, so that the fourteenth switch 322, the sixteenth switch 324, the eighteenth switch 326 and the twentieth switch 328 are closed and the thirteenth switch 321, the fifteenth switch 323, the seventeenth switch 325 and the nineteenth switch 327 are open. Consequently, the fourth input I1' is connected to the sixth output O2', the fifth input I2' is connected to the eighth output O4', the first supply terminal is connected to the fifth output O1', and the second supply terminal is connected to the seventh output O3'.

The first comparator unit output signal K1 is applied to the fourth input I1' of the second switching unit 320, and the second comparator unit output signal K2 is applied to the fifth input I2' of the second switching unit 320. The fifth output O1' yields the first clock generation signal G1, the sixth output O2' yields the second clock generation signal G2, the seventh output O3' yields the first replica clock generation signal H1, and the eighth output O4' yields the second replica clock generation signal H2. The first control signal CTRL1 and the second control signal CTRL2 correspond to the first switching state signal F1 and the second switching state signal F2, respectively.

The logic unit 400 comprises a masking unit 410 and a clock generation unit 420. The logic unit 400 takes the first clock generation signal G1, the second clock generation signal G2, the first replica clock generation signal H1, the second replica clock generation signal H2, the first propagation enable signal P1 and the second propagation enable signal P2 as inputs. The logic unit 400 generates the first clock signal C1, the second clock signal C2, the first measurement signal D1, the second measurement signal D2, the first integration disable signal E1, the second integration disable signal E2, the first switching state signal F1 and the second switching state signal F2 as outputs. These output signals serve as feedback for the first integrator unit 100, the second integrator unit 200 and the selection unit 300 as described above, thereby controlling the circuit oscillation.

The function of the masking unit 410 is to allow the propagation of the first clock generation signal G1, the second clock generation signal G2, the first replica clock generation signal H1 and the second replica clock generation signal H2 only when the corresponding propagation enable signal P1, P2 is in the active state.

The clock generation unit 420 takes the first set signal S1, the second set signal S2, the first replica set signal R1 and the second replica set signal R2 as inputs. The clock generation unit 420 generates the first clock signal C1, the second clock signal C2, the first measurement signal D1, the second measurement signal D2, the first integration disable signal E1, the second integration disable signal E2, the first switching state signal F1 and the second switching state signal F2 as outputs.

For the duration of the active state of the first propagation enable signal P1, the first clock generation signal G1 is propagated as a first set signal S1, and the first replica clock generation signal H1 is propagated as a first replica set signal R1. When the first propagation signal P1 is in the inactive state, the first set signal S1 and the first replica set signal R1 are set to the inactive state.

For the duration of the active state of the second propagation enable signal P2, the second clock generation signal G2 is propagated as a second set signal S2, and the second replica clock generation signal H2 is propagated as a second replica set signal R2. When the second propagation enable signal P2 is in the inactive state, the second set signal S2 and the second replica set signal R2 are set to the inactive state.

The first clock signal C1 and the second clock signal C2 are respectively determined by the active edges of the first set signal S1 and the second set signal S2. An active edge of the first set signal S1 triggers the change of the first clock signal C1 to the active state, which also means that the second clock signal C2 simultaneously changes to the inactive state. On the contrary, an active edge of the second set signal S2 triggers the change of the second clock signal C2 to the active state, which also means that the first clock signal C1 simultaneously changes to the inactive state.

The first measurement signal D1 is present in the active state if and only if both the first clock signal C1 and the first replica set signal R1 are in the active state. Similarly, the second measurement signal D2 is present in the active state if and only if both the second clock signal C2 and the second replica set signal R2 are in the active state.

The first integration disable signal E1 is present in the active state if and only if the first clock signal C1 is in the active state and the first replica set signal R1 is in the inactive state. Similarly, the second integration disable signal E2 is present in the active state if and only if the second clock signal C2 is in the active state and the second replica set signal R2 is in the inactive state.

The first switching state signal F1 and the second switching state signal F2 are respectively determined by the active edges of the first integration disable signal E1 and the second integration disable signal E2. An active edge of the second integration disable signal E2 triggers the change of the first switching state signal F1 to the active state, which also means that the second switching state signal F2 simultaneously changes to the inactive state. On the contrary, an active edge of the integration disable signal E1 triggers the change of the second switching state signal F2 to the active state, which also means that the first switching state signal F1 simultaneously changes to the inactive state.

In the example shown in FIG. 1, the masking unit 410 comprises a first NOR gate 411, a second NOR gate 412, a first NAND gate 413, a second NAND gate 414, a first inverter 415 and a second inverter 416. The first NOR gate 411 has the first clock generation signal G1 and the output of the first inverter 415 as inputs and yields the first set signal S1 at its output. The second NOR gate 412 has the second clock generation signal G2 and the output of the second inverter 416 as inputs and yields the second set signal S2 at its output. The first NAND gate 413 has the first propagation enable signal P1 and the first replica clock generation signal H1 as inputs and yields the first replica set signal R1 at its output. The second NAND gate 414 has the second propagation enable signal P2 and the second replica clock generation signal H2 as inputs and yields the second replica set signal R2 at its output. The first inverter 415 has the first propagation enable signal P1 as input, and the second inverter 416 has the second propagation enable signal P2 as input.

The clock generation unit 420 comprises a third NOR gate 421, a fourth NOR gate 422, a first AND gate 423, a second AND gate 424, a first flip-flop 425 and a second flip-flop 426.

The first flip-flop 425 has the first set signal S1 and the second set signal S2 as inputs and yields the first clock signal C1 and the second clock signal C2 at its outputs. It may be realized as an SR (set-reset) flip-flop, for instance. The third NOR gate 421 has the second clock signal C2 and the first replica set signal R1 as inputs and yields the first measurement signal D1 at its output. The fourth NOR gate 422 has the first clock signal C1 and the second replica set signal R2 as inputs and yields the first measurement signal D2 at its output. The first AND gate 423 has the first clock signal C1 and the first replica set signal R1 as inputs and yields the first integration disable signal E1 at its output. The second AND gate 424 has the second clock signal C2 and the second replica set signal R2 as inputs and yields the second integration disable signal E2 at its output. The second flip-flop 426 has the second integration disable signal E2 and the first integration disable signal E1 as inputs and yields the first switching state signal F1 and the second switching state signal F2 at its outputs. It may also be realized as an SR flip-flop, for instance.

In this oscillator circuit the active states of the digital signals are as follows. The active state of the first clock signal C1, the second clock signal C2, the first measurement signal D1, the second measurement signal D2, the first propagation disable signal E1, the second propagation disable signal E2, the first switching state signal F1, the second switching state signal F2, the first replica clock generation signal H1, the second replica clock generation signal H2, the first propagation enable signal P1, the second propagation enable signal P2, the first set signal S1 and the second set signal S2 is the high level. The active state of the first clock generation signal G1, the second clock generation signal G2, the first replica set signal R1 and the second replica set signal R2 is the low level.

Figure 4:
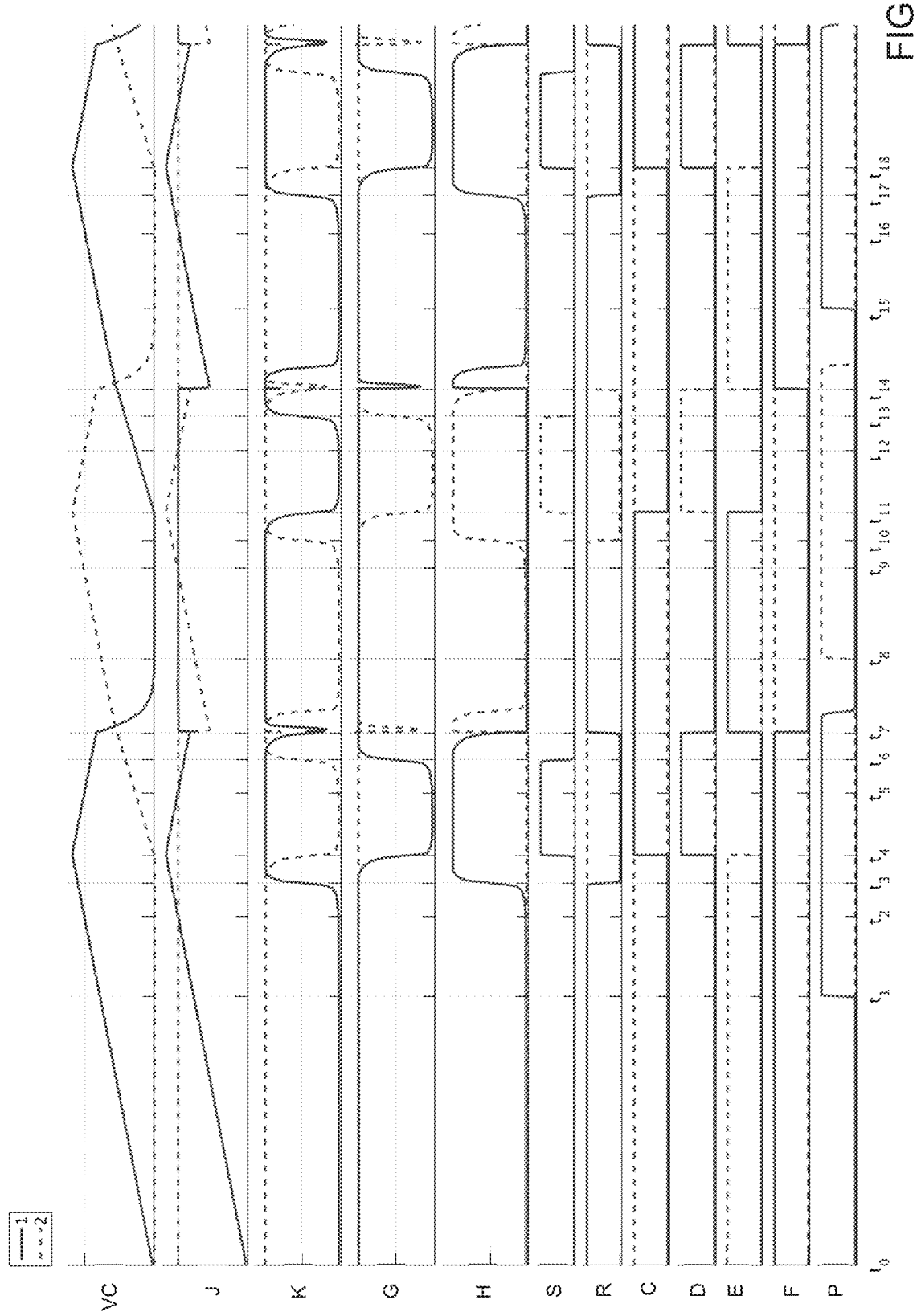
FIG. 4 is a diagram of voltages as functions of the time for the oscillator circuit according to FIG. 1.

FIG. 4 is a diagram of voltages as functions of the time representing the relevant signals occurring during the operation of the oscillator circuit. At the starting time $t_0$, the second clock signal C2 is presumed high/active and the first clock signal C1 is presumed low/inactive. The first capacitor 110 and the second capacitor 210 are presumed discharged, which means that the first integration signal VC1 and the second integration signal VC2 are equal to zero. This starting condition can be set by a start-up circuit. The comparator 317 sets the value of the first propagation enable signal P1 and the second propagation enable signal P2 to low/inactive. Since the first clock signal C1 is low/inactive and the second clock signal C2 is high/active, the other signals acquire states in accordance with the function of the logic unit 400.

Considering the values of the first propagation enable signal P1 and the second propagation enable signal P2, the masking unit 410 cannot propagate the first clock generation signal G1, the second clock generation signal G2, the first replica clock generation signal H1 and the second replica clock generation signal H2, and the values of these signals are not relevant at the starting time $t_0$. As a result, the first set signal S1 and the second set signal S2 are low/inactive, and the first replica set signal R1 and the second replica set signal R2 are high/inactive. Consequently, the first measurement signal D1 and the second measurement signal D2 are low/inactive, the first integration disable signal E1 is low/inactive, the second integration disable signal E2 is high/active, the first switching state signal F1 is high/active, and the second switching state signal F2 is low/inactive.

The states of the output signals of the logic unit 400 determine the state of the switches inside the first integrator unit 100, the second integrator unit 200 and the selection unit 300. The first switch 101 is closed. The second switch 102, the third switch 103 and the fourth switch 104 are open. The seventh switch 203 is closed. The fifth switch 201, the sixth switch 202 and the eighth switch 204 are open. The ninth switch 311 and the eleventh switch 313 are closed. The tenth switch 312 and the twelfth switch 314 are open. The thirteenth switch 321, the fifteenth switch 323, the seventeenth switch 325 and the nineteenth switch 327 are closed. The fourteenth switch 322, the sixteenth switch 324, the eighteenth switch 326 and the twentieth switch 328 are open.

According to the positions of the switches, the first current source 111 is active, while the second current source 112 and the third current source 113 are inactive. The first charging current IREF1, which now corresponds to the reference current IREF, charges the first capacitor 110. As a consequence, the first integration signal VC1 rises linearly with the slew rate equal to IREF/C. At the same time the fourth current source 211, the fifth current source 212 and the sixth current source 213 are inactive, making the second charging current IREF2 equal to zero. Since the seventh switch 203 is closed, the second integration node 221 is connected to the reference potential, making the second integration signal VC2 equal to zero.

The first switching state signal F1 and the second switching state signal F2 determine the state of the selection unit 300. The first input I1 is connected to the first output O1 of the first switching unit 310, so that the signal from the first integration node 121 is the first comparator unit input signal J1. The second input I2 is connected to the second output O2 of the first switching unit 310, so that the reference signal VREF is the second comparator unit input signal J2. The fifth input I2' is connected to the fifth output O1' of the second switching unit 320, so that the second comparator unit output signal K2 is the first clock generation signal G1. The fourth input I1' is connected to the seventh output O3' of the second switching unit 320, so that the first comparator unit output signal K1 is the first replica clock generation signal H1. The second clock generation signal G2 is set to high/inactive, and the second replica clock generation signal H2 is set to low/inactive. As a result, the second comparator 332 has the function of the original comparator, while the first comparator 331 has the function of the replica comparator. This remains true until the next change of the first switching state signal F1 and the second switching state signal F2.

At the first time $t_1$, the first integration signal VC1 becomes equal to k·VREF, k being 0.75 in the present example. As a result, the first propagation enable signal P1 becomes high/active. The states of the other signals do not change, and each switch remains in the same position as before. From now on, the masking unit 410 allows the first clock generation signal G1 and the first replica clock generation signal H1 to propagate. The first integration signal VC1 continues to rise linearly with same slew rate IREF/C as before.

At the second time $t_2$, the first integration signal VC1 becomes equal to the reference signal VREF. Around the second time $t_2$, the outputs of the first comparator 331 and the second comparator 332 start to change. Because the limited internal currents of the first comparator 331 and the second comparator 332 have to charge/discharge their internal capacitances, a propagation delay will be experienced in both cases. The first integration signal VC1 continues to rise linearly with the same slew rate as before IREF/C.

At the third time $t_3$, the first comparator unit output signal K1 changes its state from low to high. This means that the time difference between the first time $t_2$ and the third time $t_3$ is the effective propagation delay of the first comparator 331 for low-to-high transition. The first comparator unit output signal K1 has changed before the second comparator unit output signal K2, because the first comparator 331 and the second comparator 332 are designed so that the low-to-high transition of the output happens faster compared to the high-to-low transition of the output, as described above.

As a result of the change of the first comparator unit output signal K1, the first replica clock generation signal H1 changes its state from low/inactive to high/active, and the first replica set signal R1 changes its state from high/inactive to low/active. The states of the other signals do not change, and each switch remains in the same position as before.

At the fourth time $t_4$, the second comparator unit output signal K2 changes from high to low. This means that the time interval from the second time $t_2$ to the fourth time $t_4$ is the effective propagation delay $t_{d2}$ of the second comparator 332 for high-to-low transition. As a result of the change of the second comparator unit output signal K2, the first clock generation signal G1 changes its state from high/inactive to low/active, and the first set signal S1 changes from low/inactive to high/active. As a consequence of the active edge of the first set signal S1, the first clock signal C1 becomes high/active, the second clock signal C2 becomes low/inactive, the first measurement signal D1 becomes high/active, and the second integration disable signal E2 becomes low/inactive. The remaining outputs of the logic unit 400 do not change their states.

As a result of the change of the outputs of the logic unit 400, the fourth switch 104 is closed, the first switch 101 is opened, the fifth switch 201 and the sixth switch 202 are closed, and the seventh switch 203 is opened. Consequently, the third current source 113 is active, and the first current source 111 and the second current source 112 are inactive. Therefore the first charging current IREF1, which now corresponds to the reference current IREF, discharges the first capacitor 110, so that the first integration signal VC1 decreases linearly with the slew rate equal to IREF/C.

The fourth current source 211 and the fifth current source 212 are active, while the sixth current source 213 is inactive. As the seventh switch 203 is no longer closed, the second integration node 221 is no longer connected to the reference potential. Therefore the second charging current IREF2, which now corresponds to 1.5 times the reference current·IREF, charges the second capacitor 210, so that the second integration signal VC2 rises linearly with the slew rate equal to 1.5·IREF/C.

At the fifth time $t_5$, the first integration signal VC1 becomes equal to the reference signal VREF again. The only difference between the state at the fifth time $t_5$ and the state at the second time $t_2$ is that the first integration signal VC1 now has a negative slope. As the input terminals of the first comparator 331 and the second comparator 332 are connected in counter-phase, and the absolute values of slew rates are the same, the first comparator 331 enters the same phase around the fifth time $t_5$ as the second comparator 332 around the second time $t_2$. The states of the other signals do not change, and each switch remains in the same position as before. The first integration signal VC1 continues to decrease with the slew rate equal to IREF/C.

Thus one comparator is used to set the new state of the oscillator circuit, and the other comparator is used to replicate the propagation delay afterwards. The function of the comparators as the original comparator and the replica comparator changes in alternating fashion.

At the sixth time $t_6$, the second comparator unit output signal K2 changes its state from low to high. This means that the time difference between the fifth time $t_5$ and the sixth time $t_6$ is the effective propagation delay of the second comparator 332 for low-to-high transition. As a result of the change of the second comparator unit output signal K2, the first clock generation signal G1 changes its state from low/active to high/inactive, and the first set signal S1 changes its state from high/active to low/inactive. This has no influence on the rest of the oscillator circuit, and every other signal and switch remains in the same state as before.

At the seventh time $t_7$, the first comparator unit output signal K1 changes its state from high to low. This means that the time interval from the fifth time $t_5$ to the seventh time $t_7$ is the effective propagation delay $t_{d1}$ of the first comparator 331 for high-to-low transition. As a result of the change of the first comparator unit output signal K1, the first replica clock generation signal H1 changes its state from high/active to low/inactive, and the first replica set signal R1 changes its state from low/active to high/inactive.

As a consequence of the change of the first replica set signal R1, the first measurement signal D1 becomes low/inactive, and the first integration disable signal E1 becomes high/active. As a result of the active edge of the first integration disable signal E1, the first switching state signal F1 becomes low/inactive, while the second switching state signal F2 becomes high/active. The thirteenth switch 321, the fifteenth switch 323, the seventeenth switch 325 and the nineteenth switch 327 are opened, and the fourteenth switch 322, the sixteenth switch 324, the eighteenth switch 326 and the twentieth switch 328 are closed.

The second input I2 is connected to the first output O1 of the first switching unit 310, so that the reference signal VREF is the first comparator unit input signal J1. The third input I3 is connected to the second output O2 of the first switching unit 310, so that the signal from the second integration node 221 is the second comparator unit input signal J2. The fourth input I1' is connected to the sixth output O2' of the second switching unit 320, so that the first comparator unit output signal K1 is the second clock generation signal G2. The fifth input I2' is connected to the eighth output O4' of the second switching unit 320, so that the second comparator unit output signal K2 is the second replica clock generation signal H2. The first clock generation signal G1 is set to high/inactive, and the first replica clock generation signal H1 is set to low/inactive. As a result, the first comparator 331 has the function of the original comparator, while the second comparator 332 has the function of the replica comparator. This remains true until the next change of the first switching state signal F1 and the second switching state signal F2.

Since the first comparator unit input signal J1 and the second comparator unit input signal J2 are in opposite relation at the moment before the seventh time $t_7$ and at the moment after the seventh time $t_7$, the first comparator unit output signal K1 transitions to high, and the second comparator unit output signal K2 transitions to low. These transitions, although short in duration, are experienced as glitches on the second clock generation signal G2 and the second replica clock generation signal H2. However, since the second propagation enable signal P2 is still set to low/inactive, the second clock generation signal G2 and the second replica clock generation signal H2 have no effect, and the glitches cannot propagate further. The masking unit 410 removes the unwanted glitches of the first clock generation signal G1, the second clock generation signal G2, the first replica clock generation signal H1 and the second replica clock generation signal H2, which appear as a result of the switching.

As a result of the change of the outputs of the logic unit 400, the third switch 103 is closed, and the fourth switch 104 and the sixth switch are opened. As a result of the state of the switches, the first current source 111, the second current source 112 and the third current source 113 are inactive, making the first charging current IREF1 equal to zero. Since the third switch 103 is closed, the first integration node 121 is connected to the second supply terminal, especially ground, making the first integration signal VC1 equal to zero. The fourth current source 211 is active, while the fifth current source 212 and the sixth current source 213 are inactive. Therefore the second charging current IREF2, which now corresponds to the reference current IREF, charges the second capacitor 210, so that the second integration signal VC2 continues to rise linearly, now with the slew rate equal to IREF/C. As the first integration signal VC1 goes to zero, the first propagation enable signal P1 will change its state to low/inactive state, albeit with some propagation delay, as a result of the effect of the comparator 317. This means that the propagation of the first clock generation signal G1 and the first replica clock generation signal H1 is disabled from now on.

At the eighth time $t_8$, the second integration signal VC2 becomes equal to k·VREF, so that the second propagation enable signal P2 becomes high/active. The states of the other signals do not change, and each switch remains in the same position as before. The only difference is that from now on the masking unit 410 allows the second clock generation signal G2 and the second replica clock generation signal H2 to propagate, and the second integration signal VC2 continues to increase with the slew rate equal to IREF/C.

At the ninth time $t_9$, the second integration signal VC2 becomes equal to the reference signal VREF. Around the ninth time $t_9$, the outputs of the first comparator 331 and the second comparator 332 start to change. However, because the limited internal currents of the first comparator 331 and the second comparator 332 have to charge their internal capacitances, a propagation delay will be experienced in both cases. The second integration signal VC2 continues to rise with the slew rate IREF/C.

At the tenth time $t_{10}$, the second comparator unit output signal K2 changes its state from low to high. This means that the time interval from the ninth time $t_9$ to the tenth time $t_{10}$ is the effective propagation delay of the second comparator 332 for low-to-high transition. As a result of the change of the second comparator unit output signal K2, the second replica clock generation signal H2 changes its state from low/inactive to high/active, and the second replica set signal R2 changes from high/inactive to low/active. The states of the other signals do not change, and each switch remains in the same position as before.

At the eleventh time $t_{11}$, the first comparator unit output signal K1 changes from high to low. This means that the time interval between the ninth time $t_9$ and the eleventh time $t_{11}$ is the effective propagation delay of the first comparator 331 for high-to-low transition. Since the first comparator 331 experiences the same transition in the time interval from the fifth time $t_5$ to the seventh time $t_7$, the time interval between the ninth time $t_9$ and the eleventh time $t_{11}$ is equal to the effective propagation delay $t_{d1}$ of the first comparator 331.

As a result of the change of the first comparator unit output signal K1, the second clock generation signal G2 changes its state from high/inactive to low/active, and the second set signal S2 changes from low/inactive to high/active. The active edge of the second set signal S2 triggers the change of the first clock signal C1 from high/active to low/inactive and the change of the second clock signal C2 from low/inactive to high/active.

Thus one half cycle is performed in the time interval from the fourth time $t_4$ to the eleventh time $t_{11}$. Because of the symmetry of the oscillator circuit, the operation of the oscillator circuit in the time interval from the eleventh time $t_{11}$ to the sixteenth time $t_{16}$ is complementary to the operation from the fourth time $t_4$ to the eleventh time $t_{11}$. The time interval from the fourth time $t_4$ to the eighteenth time $t_{18}$ corresponds to one full cycle, which has the duration of the period T.

The measurement of the propagation delay, hence the generation of the first measurement signal D1 and the second measurement signal D2, is explained in the following with reference to FIGS. 5 and 6.

Figure 5:
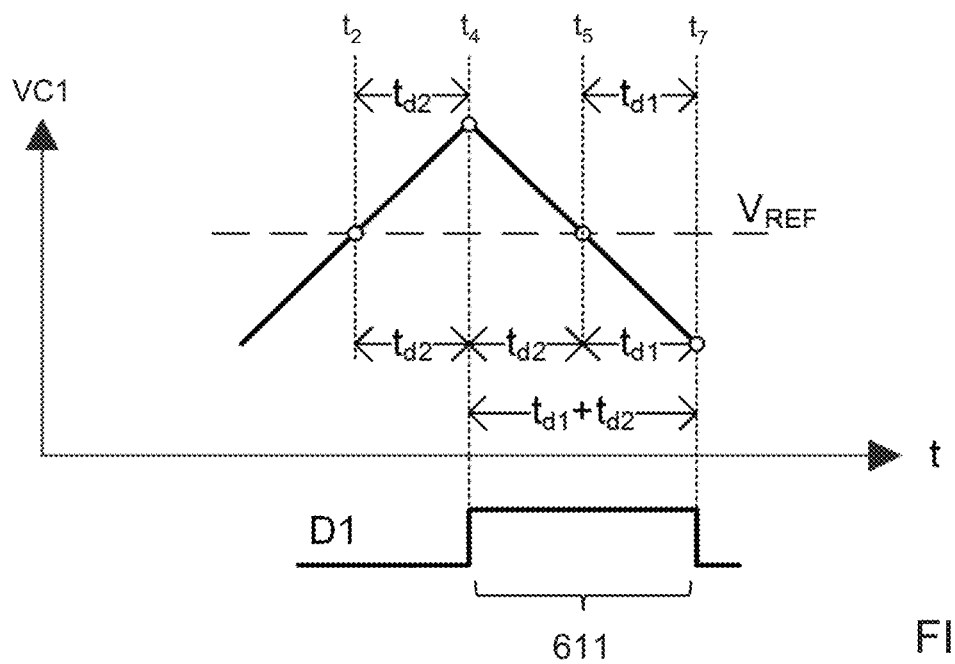
FIG. 5 is a diagram of a first integration signal as a function of the time.

FIG. 5 shows a diagram of the first integration signal VC1 and the first measurement signal D1 as functions of the time t. The first measurement signal D1 is high during a first pulse 611.

FIG. 5 shows that the first integration signal VC1 reaches the reference signal VREF at the second time $t_2$. Then the second comparator 332 experiences a second propagation delay $t_{d2}$ until the second comparator unit output signal K2 changes its state at the fourth time $t_4$. After the fourth time $t_4$, the first integration signal VC1 decreases with the same absolute value of the slew rate as before, until at the fifth time $t_5$ the first integration signal VC1 reaches the reference signal VREF again. Therefore the second propagation delay $t_{d2}$ is equal to the time interval from the fourth time $t_4$ to the fifth time $t_5$.

At the fifth time $t_5$, the first comparator 331 enters a phase that is similar to the phase that the second comparator 332 entered at the second time $t_2$. The second comparator unit output signal K2 in the time interval between the second time $t_2$ and the fourth time $t_4$ corresponds to the first comparator unit output signal K1 in the time interval between the fifth time $t_5$ and the seventh time $t_7$. The first comparator 331 experiences a first propagation delay $t_{d1}$ until the first comparator unit output signal K1 changes its state at the seventh time $t_7$. Therefore the first propagation delay $t_{d1}$ is equal to the time interval from the fifth time $t_5$ to the seventh time $t_7$.

The logic unit 400 determines the first measurement signal D1. In the described example, the first pulse 611 is started at the fourth time $t_4$ and lasts to the seventh time $t_7$. The duration of the first pulse 611 is equal to the sum of the duration of the first propagation delay $t_{d1}$ and the duration of the second propagation delay $t_2$. In the time interval represented in FIG. 5, the oscillator circuit experiences the second propagation delay $t_{d2}$ and measures the summed propagation delay $t_d = t_{d1} + t_{d2}$ as the duration of the first pulse 611.

Figure 6:
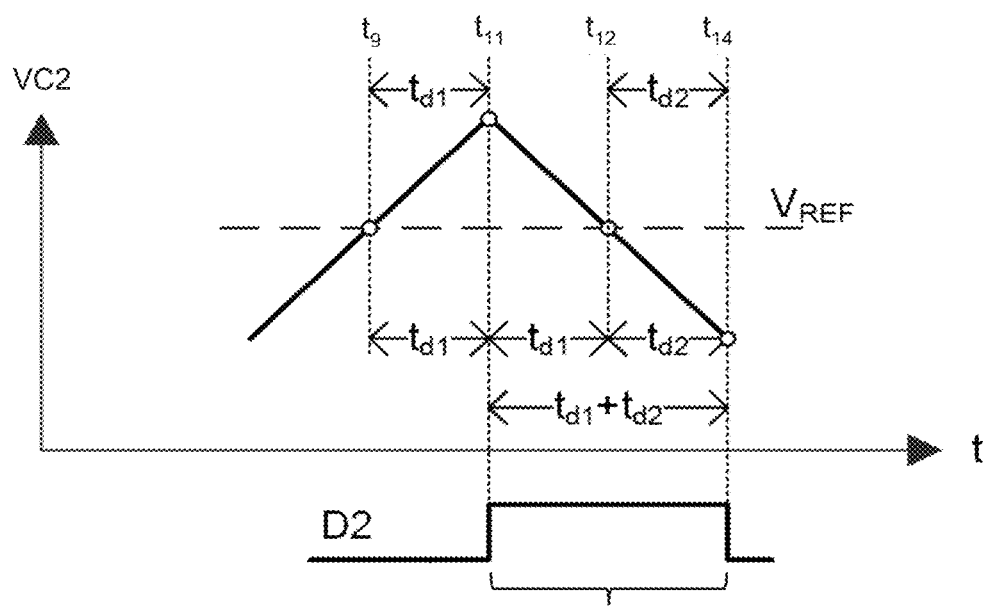
FIG. 6 is a diagram of a second integration signal as a function of the time.

FIG. 6 shows a diagram of the second integration signal VC2 and the second measurement signal D2 as functions of the time t. The second measurement signal D2 is high during a second pulse 612.

FIG. 6 shows that the second integration signal VC2 reaches the reference signal VREF at the ninth time $t_9$. Then the first comparator 331 experiences a first propagation delay $t_{d1}$ until the first comparator unit output signal K1 changes its state at the eleventh time $t_{11}$. After the eleventh time $t_{11}$, the second integration signal VC2 decreases with the same absolute value of the slew rate as before, until at the twelfth time $t_{12}$ the second integration signal VC2 reaches the reference signal VREF again. Therefore the first propagation delay $t_{d1}$ is equal to the time interval from the eleventh time $t_{11}$ to the twelfth time $t_{12}$.

At the twelfth time $t_{12}$, the second comparator 332 enters a phase that is similar to the phase that the first comparator 331 entered at the ninth time $t_9$. The first comparator unit output signal K1 in the time interval between the ninth time $t_9$ and the eleventh time $t_{11}$ corresponds to the second comparator unit output signal K2 in the time interval between the twelfth time $t_{12}$ and the fourteenth time $t_{14}$. The second comparator 332 experiences the second propagation delay $t_{d2}$ until the second comparator unit output signal K2 changes its state at the fourteenth time $t_{14}$. Therefore the second propagation delay $t_{d2}$ is equal to the time interval from the twelfth time $t_{12}$ to the fourteenth time $t_{14}$.

The second pulse 612 is started at the eleventh time $t_{11}$ and lasts to the fourteenth time $t_{14}$. The duration of the second pulse 612 is equal to the sum of the duration of the first propagation delay $t_{d1}$ and the duration of the second propagation delay $t_{d2}$. In the time interval represented in FIG. 6, the oscillator circuit experiences the first propagation delay $t_{d1}$ and measures the summed propagation delay $t_d = t_{d1} + t_2$ as the duration of the second pulse 612.

A comparison of FIGS. 5 and 6 shows that the waveform of the second integration signal VC2 between the ninth time $t_9$ and the fourteenth time $t_{14}$ is similar to the waveform of the first integration signal VC1 between the second time $t_2$ and the seventh time $t_7$. Since the functions of the first comparator 331 and the second comparator 332 are reversed, a complementary behavior is observed.

The complete propagation delay is equal to the sum of the first propagation delay $t_{d1}$ associated with the first comparator 331 and the second propagation delay $t_{d2}$ associated with the second comparator 332. The summed propagation delay $t_d$ is measured in a first half cycle of the period T in the form of the first measurement signal D1 and again in a second half cycle of the period T in the form of the second measurement signal D2. From this observation it is clear that the summed propagation delay $t_d$ is always measured accurately, even if the comparators are poorly matched.

Since the delay is always measured from the moment when the integration on the relevant integration unit has finished and the integration on the other integration unit has started, it is possible to apply the feedback real-time, increasing the speed of the integration on the integrating unit in such a way that the influence of the delay on the period T is completely canceled out.

The accuracy of the cancelation procedure is determined by the matching of the first current source 111, the second current source 112 and the third current source 113 to one another and the matching of the fourth current source 211, the fifth current source 212 and the sixth current source 213 to one another. The matching is accomplished to a desired degree by an appropriate dimensioning of the current sources.

Figure 7:
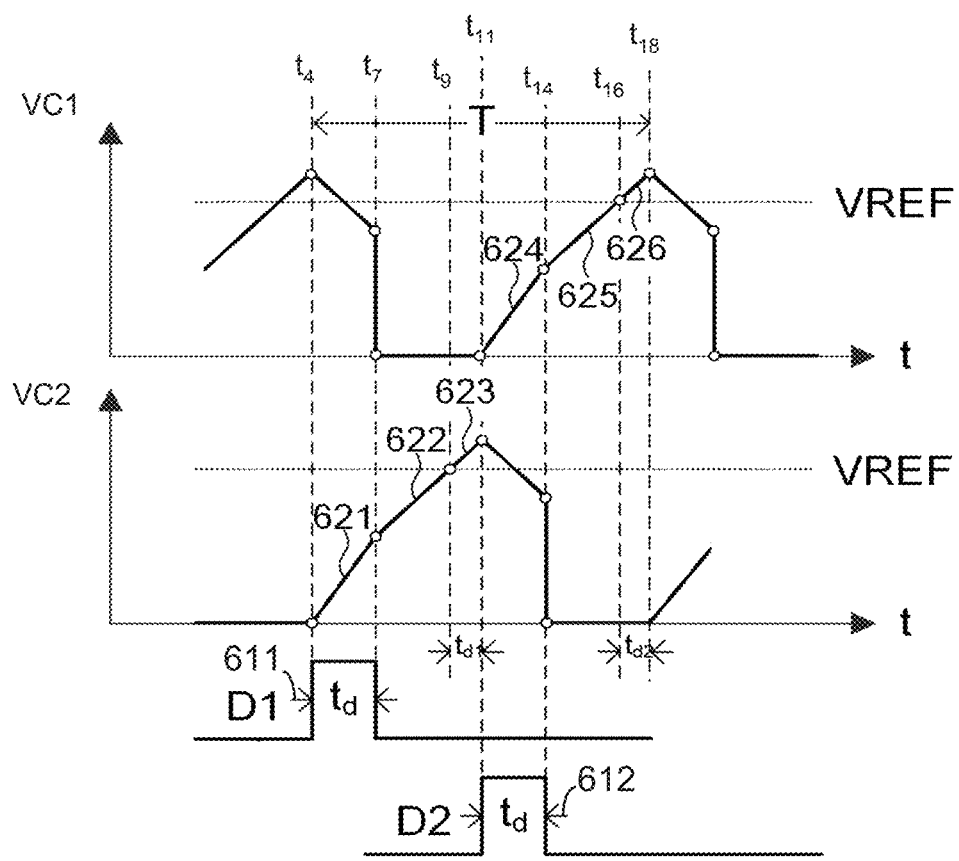
FIG. 7 is a further diagram of the first and second integration signals as functions of the time.

FIG. 7 is a further diagram of the first and second integration signals VC1, VC2 as functions of the time. In the following, the timing of one oscillation cycle is analysed in order to explain the delay cancelation procedure.

The first line segment 621, which is part of the line representing the second integration signal VC2, extends in the time interval from the fourth time $t_4$ to the seventh time $t_7$. This time interval is equal to the summed propagation delay $t_d$. At the fourth time $t_4$, the second integration signal VC2 is zero. As slew rate of the second integration signal VC2 is equal to 1.5·IREF/C, at the seventh time $t_7$ the second integration signal VC2 is 1.5·$t_d$·IREF/C. The second line segment 622, which is part of the line representing the second integration signal VC2, extends in the time interval from the seventh time $t_7$ to the ninth time $t_9$. The duration of the second line segment 622 is equal to the voltage difference divided by the slew rate:

$$t_9 - t_7 = \frac{VC2(t_9) - VC2(t_7)}{\frac{dVC2}{dt}\bigg|_{t_7:t_9}} = \frac{VREF - \frac{3IREF}{2C} \cdot t_d}{\frac{IREF}{C}} = C \cdot \frac{VREF}{IREF} - \frac{3}{2C} \cdot t_d.$$

The third line segment 623, which is part of the line representing the second integration signal VC2, extends in the time interval from the ninth time $t_9$ to the eleventh time $t_{11}$. This time interval is equal to the first propagation delay $t_{d1}$.

The fourth line segment 624, which is part of the line representing the first integration signal VC1, extends in the time interval from the eleventh time $t_{11}$ to the fourteenth time $t_{14}$. In the time interval from the eleventh time $t_{11}$ to the eighteenth time $t_{18}$, the first integration signal VC1 is similar to the second integration signal VC2 in the time interval from the fourth time $t_4$ to the eleventh time $t_{11}$. Therefore the duration of the fourth line segment 624 is equal to the summed propagation delay $t_d$. The first integration signal VC1 is zero at the eleventh time $t_{11}$ and equal to 1.5·$t_d$·IREF/C at the fourteenth time $t_{14}$.

The fifth line segment 625, which is part of the line representing the first integration signal VC1, extends in the time interval from the fourteenth time $t_{14}$ to the sixteenth time $t_{16}$. The duration of the fifth line segment 625 is $$t_{16} - t_{14} = \frac{VC1(t_{16}) - VC1(t_{14})}{\frac{dVC1}{dt}\bigg|_{t_{14}:t_{16}}} = \frac{VREF - \frac{3IREF}{2C} \cdot t_d}{\frac{IREF}{C}} = C \cdot \frac{VREF}{IREF} - \frac{3}{2C} \cdot t_d.$$

The sixth line segment 626, which is part of the line representing the first integration signal VC1, extends in the time interval from the sixteenth time $t_{16}$ to the eighteenth time $t_{18}$. This time interval is equal to the second propagation delay $t_{d2}$.

Summing all time intervals between the fourth time $t_4$ and the eighteenth time $t_{18}$, we obtain the following expression for the period T:

$$T = 2 \cdot \left( C \cdot \frac{VREF}{IREF} - \frac{3}{2} \cdot t_d \right) + 2 \cdot t_d + t_{d1} + t_{d2} = 2 \cdot C \cdot \frac{VREF}{IREF}.$$

If an equivalent resistor R is defined by R=VREF/IREF, the above equation can be written as T=2·C·R.

The preceding derivation shows that the influence of the propagation delay of the comparators on the period T of the oscillation is completely canceled. The influence of the propagation delay of the logic gates has been neglected for the purpose of this analysis. The reference signal VREF is dimensioned in accordance with the operating regions of the current sources and the comparators. The scaling factor k is set to enable the propagation of the required signals during the time interval from the second time $t_2$ to the seventh time $t_7$ and during the time interval from the ninth time $t_9$ to the fourteenth time $t_{14}$ (plus margin), and disable it else.

As the comparator unit 330 comprises only two comparators, power consumption and area are reduced compared to the oscillator circuit according to FIG. 8. Moreover, since the chopping is performed in such a way that the roles of the two comparators are alternated every half cycle, the effect of the mismatch of the comparators gets completely canceled. This allows to reduce the dimensions of the comparators, thus decreasing their input capacitances without adversely affecting the precision. Furthermore, the remaining influence of the input capacitance can be canceled by charge redistribution during chopping.

We claim:

1. An oscillator circuit, comprising:
   a first integrator unit with a first capacitor configured to be charged at a first integration node, and a second integrator unit with a second capacitor configured to be charged at a second integration node, each integrator unit including switchable current sources,
   a comparator unit arranged between a first switching unit and a second switching unit, the comparator unit comprising a first comparator and a second comparator, the first switching unit having a first input connected to the first integration node, a second input connected to a reference signal, and a third input connected to the second integration node, the comparator unit being configured to compare a signal at the first input or a signal at the third input with the reference signal, a logic unit, the second switching unit being connected to the logic unit, the logic unit being configured to provide signals controlling the first integrator unit, the second integrator unit, the first switching unit and the second switching unit, the signals generating a periodic operation by alternatingly activating the first integrator unit and the second integrator unit, a first output of the first switching unit being connected to a non-inverting input of the first comparator and to an inverting input of the second comparator, and a second output of the first switching unit being connected to an inverting input of the first comparator and to a non-inverting input of the second comparator.

2. The oscillator circuit of claim 1, further comprising:
a first integration signal corresponding to the charging of the first capacitor,
a second integration signal corresponding to the charging of the second capacitor, and
wherein the periodic operation comprise a plurality of periods, each period having a duration equal to the performance of:
   charging the first capacitor with a first slew rate, while the second integration signal is zero, until the first integration signal exceeds the reference signal by a predefined value,
   then discharging the first capacitor with the first slew rate, while the second capacitor is charged with a second slew rate, which is larger than the first slew rate, until the first integration signal has fallen below the reference signal by a further predefined value,
   then charging the second capacitor with the first slew rate, while the first integration signal is zero, until the second integration signal exceeds the reference signal by the predefined value, and
   then discharging the second capacitor with the first slew rate, while the first capacitor is charged with the second slew rate, until the second integration signal has fallen below the reference signal by the further predefined value.

3. The oscillator circuit of claim 1, further comprising:
a first supply terminal for a supply voltage and a second supply terminal for a reference potential,
a first switch, a second switch, a third switch and a fourth switch of the first integrator unit,
a fifth switch, a sixth switch, a seventh switch and an eighth switch of the second integrator unit,
a first current source connected between the first supply terminal and the first switch,
a second current source connected between the first supply terminal and the second switch,
a third current source connected between the second supply terminal and the fourth switch,
the first switch being connected between the first current source and the first integration node,
the second switch being connected between the second current source and the first integration node,
the third switch being connected between the second supply terminal and the first integration node,
the fourth switch being connected between the third current source and the first integration node,
a fourth current source connected between the first supply terminal and the fifth switch,
a fifth current source connected between the first supply terminal and the sixth switch,
a sixth current source connected between the second supply terminal and the eighth switch, the fifth switch being connected between the fourth current source and the second integration node,
the sixth switch being connected between the fifth current source and the second integration node,
the seventh switch being connected between the second supply terminal and the second integration node, and
the eighth switch being connected between the sixth current source and the second integration node.

4. The oscillator circuit of claim 1, further comprising:
a ninth switch between the first input and the first output,
a tenth switch between the second input and the first output,
an eleventh switch between the second input and the second output, and
a twelfth switch between the third input and the second output,
the ninth switch and the eleventh switch being configured to open simultaneously with one another and to close simultaneously with one another, and
the tenth switch and the twelfth switch being configured to open simultaneously with one another and to close simultaneously with one another.

5. The oscillator circuit of claim 4, further comprising:
a third output and a fourth output of the first switching unit, and
a propagation enable signal generation circuit connected to the first input, the second input, the third input, the third output and the fourth output, the propagation enable signal generation circuit comparing the reference signal at the second input with a signal at the first input and with a signal at the third input.

6. The oscillator circuit of claim 4, further comprising:
a fourth input and a fifth input at the second switching unit, the fourth input being connected to an output of the first comparator and the fifth input being connected to an output of the second comparator,
a fifth output, a sixth output, a seventh output and an eighth output at the second switching unit,
a thirteenth switch between the fourth input and the seventh output,
a fourteenth switch between the second supply terminal and the seventh output,
a fifteenth switch between the first supply terminal and the sixth output,
a sixteenth switch between the fourth input and the sixth output,
a seventeenth switch between the fifth input and the fifth output,
an eighteenth switch between the first supply terminal and the fifth output,
a nineteenth switch between the second supply terminal and the eighth output, and
a twentieth switch between the fifth input and the eighth output,
the thirteenth switch, the fifteenth switch, the seventeenth switch and the nineteenth switch being configured to open simultaneously with one another and to close simultaneously with one another, and
the fourteenth switch, the sixteenth switch, the eighteenth switch and the twentieth switch being configured to open simultaneously with one another and to close simultaneously with one another.

7. The oscillator circuit of claim 1, further comprising:
a first NOR gate, a second NOR gate, a first NAND gate and a second NAND gate of the logic unit,
the first NOR gate being connected to the first switching unit via a first inverter and to the second switching unit, the second NOR gate being connected to the first switching unit via a second inverter and to the second switching unit, and the first NAND gate and the second NAND gate being connected to the first switching unit and to the second switching unit.

8. The oscillator circuit of claim 7, further comprising:

a third NOR gate, a fourth NOR gate, a first AND gate, a second AND gate, a first flip-flop and a second flip-flop of the logic unit, inputs of the first flip-flop being connected to outputs of the first NOR gate and the second NOR gate, one output of the first flip-flop being connected to inputs of the fourth NOR gate and the first AND gate, another output of the first flip-flop being connected to inputs of the third NOR gate and the second AND gate, a further input of the third NOR gate being connected to an output of the first NAND gate and to a further input of the first AND gate, a further input of the fourth NOR gate being connected to an output of the second NAND gate and to a further input of the second AND gate, outputs of the first AND gate and the second AND gate being connected to inputs of the second flip-flop, and outputs of the second flip-flop being connected to the first switching unit and the second switching unit.

9. The oscillator circuit of claim 8, wherein the signals controlling the first integrator unit and the second integrator unit are provided at outputs of the third NOR gate, the fourth NOR gate, the first AND gate, the second AND gate and the first flip-flop, and the signals controlling the first switching unit and the second switching unit are provided at the outputs of the second flip-flop.

* * * * *